United States Patent [19]

Anderson et al.

[11] Patent Number: 5,761,037
[45] Date of Patent: Jun. 2, 1998

[54] ORIENTATION INDEPENDENT EVAPORATOR

[75] Inventors: Timothy Merrill Anderson; Gregory Martin Chrysler; Richard Chao-Fan Chu, all of Poughkeepsie, N.Y.

[73] Assignee: International Business Machines Corporation, Armonk, N.Y.

[21] Appl. No.: 598,593

[22] Filed: Feb. 12, 1996

[51] Int. Cl.⁶ ............................................. H05K 7/20
[52] U.S. Cl. ................... 361/700; 62/259.2; 165/80.4; 165/104.26
[58] Field of Search ................... 165/80.3, 185, 165/80.4, 104.21, 104.14, 104.26, 104.23; 62/225, 515, 516, 259.2; 174/15.2; 257/714; 361/690, 698, 699, 700, 717–719

[56] References Cited

U.S. PATENT DOCUMENTS

| | | |
|---|---|---|
| 4,495,988 | 1/1985 | Grossman ................... 165/96 |
| 4,800,956 | 1/1989 | Hamburgen . |
| 4,825,661 | 5/1989 | Holtzapple . |
| 5,201,196 | 4/1993 | Faghri ................... 62/489 |
| 5,253,702 | 10/1993 | Davidson . |
| 5,269,372 | 12/1993 | Chu et al. . |
| 5,329,993 | 7/1994 | Ettehadieh . |

FOREIGN PATENT DOCUMENTS

WO83/03945  11/1983  WIPO ................... 361/700

OTHER PUBLICATIONS

Thyristor–Chopper . . . System, Awano (Mitsubishi) #59059 vol. 4 No. 6, Mitsubishi Electric Adv (Japan) pp. 5–7 Jun. 1978.

Chrysler et al., "Enhanced Thermosyphon Cooling Scheme", IBM Technical Disclosure Bulletin, vol. 37, No. 10, Oct., 1994 pp. 11–12.

*Primary Examiner*—Gerald P. Tolin
*Attorney, Agent, or Firm*—Lawrence D. Cutter

[57] ABSTRACT

In accordance with a preferred embodiment of the present invention, an orientation independent evaporator includes a wicking member which also operates as a manifold which possesses a number of surface accessible channels preferably via grooves cut in either side of a slab of wicking material at right angles to one another. The evaporator is, because of the structure of this wicking member, able to be operated in any orientation with respect to a gravitational field. The invention provides an improved evaporator for use in thermosyphons, and in particular, provides an improved mechanism for cooling electronic components.

12 Claims, 3 Drawing Sheets

ORIENTATION INDEPENDENT EVAPORATOR

BACKGROUND OF THE INVENTION

The present invention is generally directed to evaporators useful in thermosyphon systems. More particularly, the present invention is directed to an evaporator which may be employed in a plurality of different physical orientations thus rendering the utilization of thermosyphon systems more practical for cooling electronic circuit components. Even more particularly, the present invention is directed to an orientation independent evaporator which provides enhanced cooling for electronic circuit modules.

Over the last 50 years, there has been a continual need and desire to increase circuit package density associated with electronic circuits. More and more electronic circuits are being packaged in smaller and smaller volumes. This fact, coupled with the desire to operate these systems at higher and higher frequencies, has created cooling problems because of the resultant high thermal fluxes that result. In many circumstances it is seen that thermal considerations can provide undesirable limits for circuit operation particularly in those circumstances where circuit speed requires placement of circuits in close proximity to one another to minimize electrical signal propagation delay.

Because of the desire to package electronic circuits in close proximity to one another, one wishes to employ a minimal volume heat removal mechanism for circuits which must be cooled. One of the approaches that is taken to achieve this objective is the utilization of thermosyphons which are employed essentially as space transformers to control the fraction of the total circuit package volume which is dedicated to thermal management. While the utilization of thermosyphons achieves the objective of decreasing the thermal management volume which is in close proximity to the electronic package, it should, nonetheless, be appreciated that the total volume of thermal management hardware may not necessarily be decreased. However, it is important to be able to decrease the volume of thermal management hardware which must be placed in close proximity to the electronic circuit package to achieve the desired goal of increased electronic circuit package density.

However, by their very nature, passive thermosyphons depend on gravity for their operation and are, therefore, sensitive to their physical orientation.

The two primary components of a thermosyphon, namely, the evaporator or boiler and the condenser, must be arranged with the condenser above the evaporator section. Additionally, the individual evaporator and condenser components have preferred, or even required, orientations. The limiting aspects of this last property of thermosyphon thermal management systems provide the focal point for the present invention. Specifically, it is seen that it is desirable to be able to provide an evaporator that is insensitive to gravitational orientation. An orientation independent evaporator would allow the designer of electronic systems to provide a single processor board part that could be mounted vertically in desk-side machines as well as horizontally in desk-top electronic systems, such as personal computers. Likewise, an orientation independent evaporator could be employed in a laptop computer which is often balanced or even mounted, as a controller to a larger machine, perhaps, in a priori unknown orientations.

The present invention employs a wick within the interior of the evaporator housing. An evaporator having similar objectives to the present invention and also employing an interior wick is described in U.S. Pat. No. 4,825,661, issued May 2, 1989, to Holtzapple et al. However, the evaporator design which is apparently illustrated in this patent is different from that which is described herein in many significant regards. In particular, the wicking material in Holtzapple et al. is not in contact with the thermal surface which is to be cooled. Furthermore, the flow in the centrally provided channel, or even in other interior grooves, has no component which is directed toward an interior surface which is in contact with the object which is to be cooled. Furthermore, there is no contact with a heat-spreading wick mat. Additionally, the grooves or channels shown in Holtzapple et al. do not interconnect with one another; they merely provide separate volumes and do not, apparently, contribute to the orientation independent properties which otherwise might be claimed by Holtzapple et al. Furthermore, the grooves or channels provided in the wicking material shown in Holtzapple et al. do not pass through the wicking material. And lastly, but not limited hereto, the device illustrated in FIGS. 1 and 2 of Holtzapple et al. provides only a very low volume of wicking material. Accordingly, such a device would not be useful for meeting the objectives required herein.

SUMMARY OF THE INVENTION

In accordance with a preferred embodiment of the present invention, an orientation independent evaporator for cooling a body comprises a housing which includes an extended surface for placement in thermal contact with the body which is to be cooled. This surface is, accordingly, exposed to the interior of the housing. A wicking layer is provided in thermal contact with the extended surface within the housing. And most importantly for the present invention, there is provided a wicking member in contact with the wicking layer within the housing. The wicking member possesses a plurality of surface accessible channels which permit passage of cooling fluid vapor generated within the housing. Typically, the vapor is generated at the wicking layer because of its contact with the thermal contact surface of the housing which is preferably disposed in close thermal contact with the body to be cooled.

In accordance with a preferred embodiment of the present invention, the wicking member preferably includes channels therein in which the channels comprise grooves on both sides of the flat wicking member. On one side of the wicking member, the grooves extend in a first direction, and on the opposite side of the wicking member, the grooves extend in a direction at an angle to the direction of the grooves on the other side. Typically, this angle is 90°. These grooves on each side of the wicking member are in fluid communication with the grooves on the other side. The geometry and structure of the wicking member provide the mechanism by which the evaporator may be operated in any orientation.

Accordingly, it is the object of the present invention to permit the utilization of more closely packed electronic circuit chips and modules.

It is also an object of the present invention to reduce the physical volume of thermal management hardware which is deployed in the vicinity of electronic components which are to be cooled.

It is still another object of the present invention to more efficiently cool electronic circuit chips and devices so that they may be operated at higher speeds.

It is a still further object of the present invention to provide an improved thermosyphon.

It is also an object of the present invention to provide an evaporator which may be operated in any convenient orientation with respect to the gravitational field in which it is operated.

It is yet another object of the present invention to provide an economical and easily manufacturable evaporator and thermosyphon.

It is a still further object of the present invention to extend the range of situations in which thermosyphons may be employed.

Lastly, but not limited hereto, it is an object of the present invention to provide improved thermal management systems for personal computers and other mobile pieces of electronic equipment.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
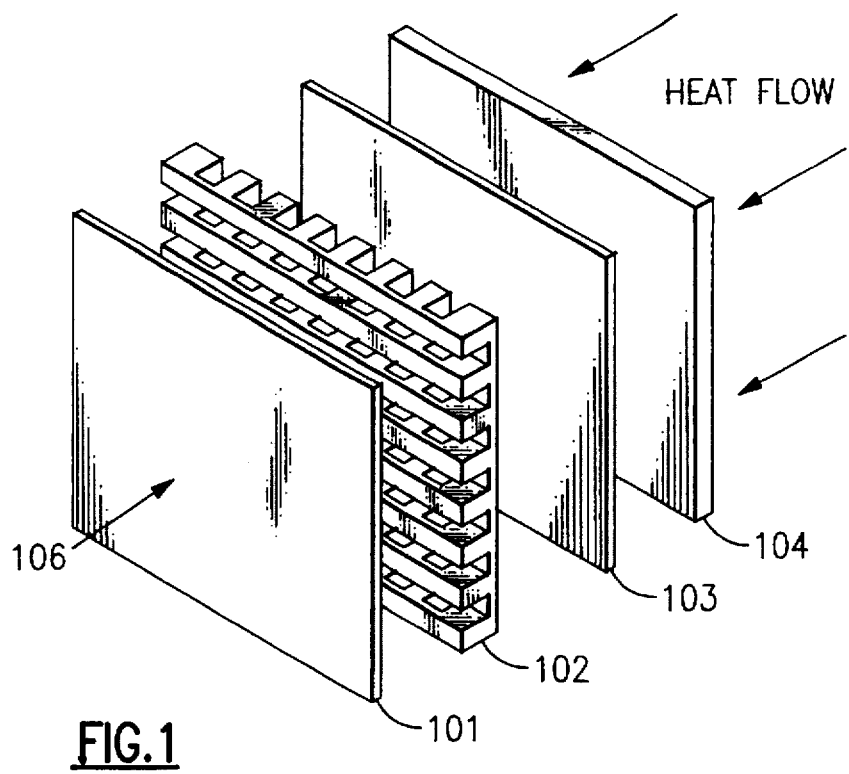
FIG. 1 is an exploded isometric view illustrating the interior components of an orientation independent evaporator in accordance with the present invention.

The construction of an orientation independent evaporator in accordance with the present invention is at least partially illustrated in FIG. 1. The evaporator combines the gravity-independent characteristics of a heat pipe with a remote condenser and generally wickless nature of passive thermosyphons.

In accordance with the present invention, the evaporator includes a housing for containment of the working fluid. The housing possesses a surface 104 which is placed in thermal contact with the object body, chip or module to be cooled. Thus, surface 104 is a housing surface which is heated and which, thus, causes evaporation of coolant fluid. In particular, it is noted that surface 104 is an operative portion of the housing insofar as it has an exterior portion which is placed in contact with the heat source and which also includes an interior portion which is exposed within the interior portion of the evaporator housing. In particular, it is noted the evaporator housing may, in fact, comprise heated surface 104 and cap 105 (see FIG. 2).

Immediately adjacent to heated surface 104, there is disposed wicking layer 103 which preferably comprises a material such as sintered copper, aluminum foam, silicon carbide, vitreous carbon, copper mesh or screen or any other similar wicking material. Those of ordinary skill in the art are fully capable of selecting other materials for wicking layer 103 based on its ability to act as a wick and its thermal conduction properties.

An important aspect of the present invention includes wick member 102 which is also describable as a wick manifold section. Wicking member 102 provides not only wicking action between wicking layer 103 and optional wicking spreader 101 but also provides a mechanism for vapor passage. Furthermore, the structure of wicking member/manifold 102 renders it operable in any orientation with respect to the gravitational field in which it is operating. Wicking manifold section 102 preferably comprises material formed from a machinable metallic open-cell foam, such as those described above.

Lastly, as shown in FIG. 1, it is seen that one may employ a wicking spreader layer 101 comprising material similar to wicking layer 103.

Figure 2:
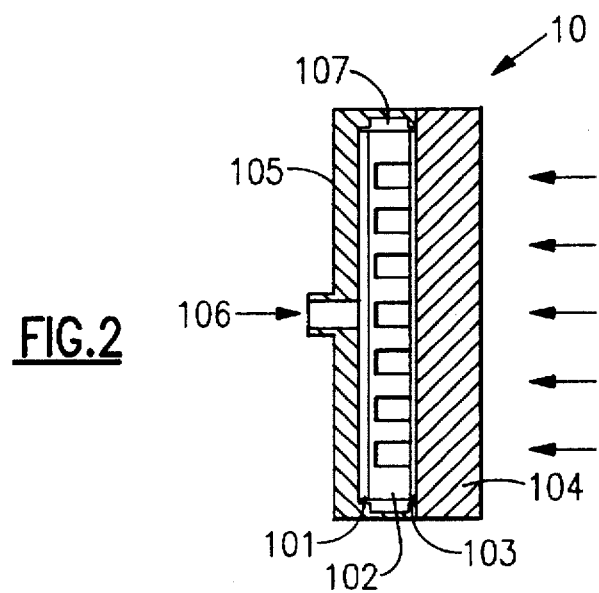
FIG. 2 is a cross-sectional side elevation view of an evaporator in accordance with the present invention which more particularly illustrates the operative placement of the elements illustrated in FIG. 1.
Figure 3A:
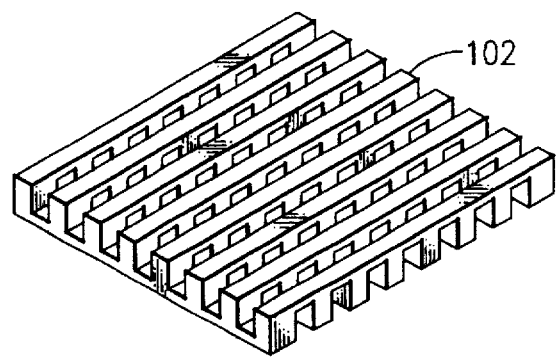
FIG. 3A is an isometric view of a wicking member in accordance with the present invention.
Figure 3B:
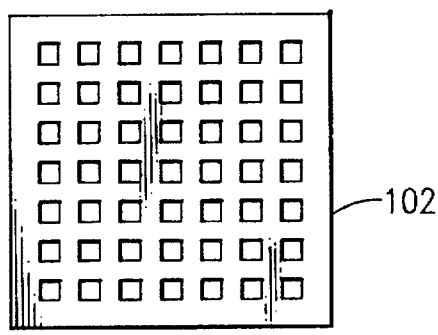
FIG. 3B is a top view of the wicking member shown in FIG. 3A.
Figure 3C:
FIG. 3C is a front view of the wicking member shown in FIG. 3A.
Figure 3D:
FIG. 3D is a side view of the wicking member shown in FIG. 3A.

The components illustrated in FIG. 1 are shown in an assembled evaporator version in FIG. 2. In particular, it is seen that wicking members 101, 102, and 103 are disposed in a housing which comprises thermally conductive surface 104 together with cap 105. It is further noted that cap 105 is provided with an inlet port 106 which is in direct flow communication with wick manifold 102, optionally through spreader wick 101. It is further noted that cap 105 is provided with exhaust port 107 situated along the perimeter of containment shell or cap 105.

In operation, liquid working fluid from a condenser is fed from the centrally located liquid inlet port 106 to wick manifold 102 through to optional spreader wick 101. From wick manifold 102, the working fluid is drawn into wicking material layer 103 for evaporation where it absorbs energy from heated surface 104 and is converted into vapor. The vapor freely passes through the channels in the vapor manifold 102 and on to exhaust port 107 situated at the perimeter of containment shell 105.

An important aspect of the present invention is wick manifold 102 which is described in more detail below in FIGS. 3A through 3D. This structure provides both a wicking mechanism and a vapor escape manifold. Its shape ensures that regardless of the orientation of the evaporator, working fluid is still delivered to heated surface 104, and more critically, that the generated vapor is provided with a low resistance path so as to be able to escape the evaporator section and be supplied to a condenser. For optimal performance, it may be desirable to form wicking member 102 from a machinable metallic open-cell foam. Additionally, it may prove beneficial to metallurgically bond the three wicking sections together and also to heated surface 104. This is desirable for two reasons: first, to minimize the resistance to a capillary flow from the liquid inlet to the heated surface; and secondly, to allow the manifold wick to actively participate in the evaporation process as an extended surface.

Figure 4:
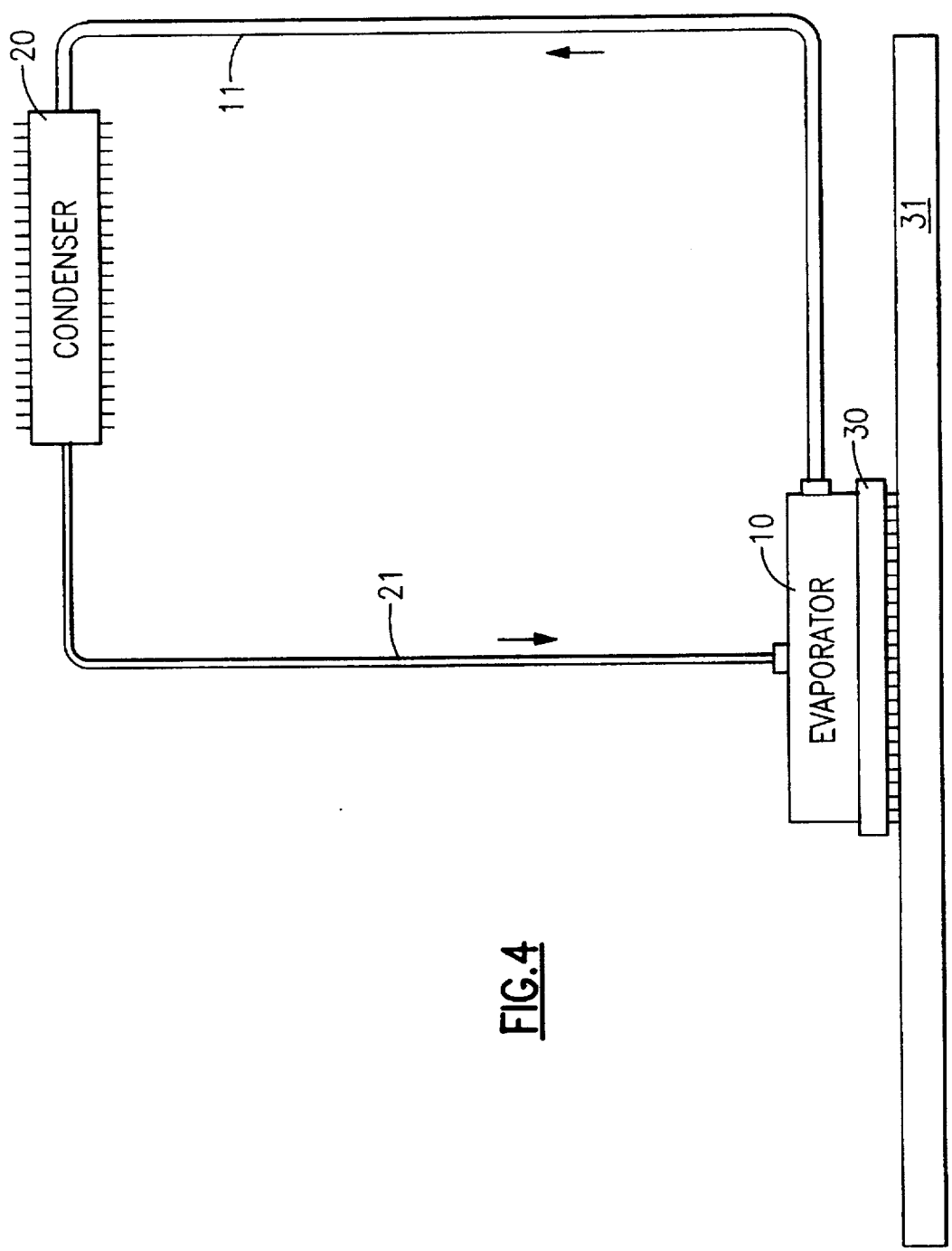
FIG. 4 is a side view illustrating, partially in block diagram form, a thermosyphon system employing the evaporator described herein.

The evaporator of the present invention may be employed in a cooling system such as that shown in FIG. 4. In particular, it is seen therein that evaporator 10 is disposed so that surface 104 is in thermal contact with chip or module 30 which is disposed on a printed circuit board or other circuit board 31. Chip or module 30 is, therefore, the source for thermal energy which drives the thermosyphon system shown. In particular, vapors from evaporator 10 are supplied through conduit 11 to condenser 20. In condenser 20 the fluid vapors are returned to the liquid state and thence pass through conduit 21 back through evaporator 10 where the process is repeated. In this way thermal energy is removed from chip 30 in an efficient fashion which does not consume significant physical volume near the object which is to be cooled.

In preferred embodiments of the present invention, heated housing surface 104 preferably comprises a highly thermally conductive material such as a metal, and more particularly, a material such as copper or aluminum. Housing cap or containment shell 105 preferably comprises a material such as metal, plastic or ceramic and cap 105 is affixed to heated surface 104 by any convenient means such as by adhesive, glue, epoxy, solder or by mechanical means using an O-ring, compression ring or gasket seal. Furthermore, it is noted that cap 105 preferably includes a peripheral vapor exhaust port 107.

From the above, it should, therefore, be appreciated that the present invention provides an evaporator for a thermosyphon system which may be operated in any position. It is also seen that the evaporator of the present invention is readily and economically manufacturable. Lastly, it is seen that the evaporator of the present invention fully and completely meets and satisfies all of the objectives stated above.

Fluids which could be used include water, which would have to be employed at sub-ambient temperatures, any of the common refrigerants and especially fluorocarbons (also called dielectric fluorocarbon refrigerants).

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An orientation independent evaporator for cooling a body, said evaporator comprising:
   a housing for containing an evaporatable cooling fluid, said housing having an extended surface for thermal contact with said body which is to be cooled, said extended surface having at least a portion thereof exposed to interior portions of said housing which also includes an inlet port;
   a wicking layer in thermal contact with said extended surface and disposed within the interior of said housing; and
   a wicking member in contact with said wicking layer, said wicking member also being disposed in said housing, said wicking member having a plurality of surface accessible channels, said channels being regularly shaped and sufficiently wide for the passage of liquid phase cooling fluid therethrough without capillary action, said channels not being pores, and which also permit passage of cooling fluid vapor generated at said wicking layer through said wicking member to an exhaust port in said housing.

2. The evaporator of claim 1 in which said wicking member channels comprise grooves on one side extending in a first direction and grooves on an opposite side thereof extending in a direction at an angle to said first direction, said grooves on each side being in fluid communication with said grooves on said opposite side.

3. Evaporator of claim 2 in which said first and second directions are at right angles to one another.

4. Evaporator of claim 1 in which said wicking layer comprises a material selected from the group consisting of sintered copper, aluminum foam, silicon carbide, vitreous carbon, copper mesh and copper screen.

5. Evaporator of claim 1 in which said wicking member comprises a material selected from the group consisting of sintered copper, aluminum foam, silicon carbide, vitreous carbon, copper mesh and copper screen.

6. The evaporator of claim 1 further including a spreader wick disposed against said wicking member on the opposite side thereof from said wicking layer.

7. A thermosyphon system comprising:
   a housing for containing an evaporatable cooling fluid, said housing having an extended surface for thermal contact with said body which is to be cooled, said extended surface having at least a portion thereof exposed to interior portions of said housing which also includes an inlet port;
   a wicking layer in thermal contact with said extended surface and disposed within the interior of said housing; and
   a wicking member in contact with said wicking layer, said wicking member also being disposed in said housing, said wicking member having a plurality of surface accessible channels, said channels being regularly shaped and sufficiently wide for the passage of liquid phase cooling fluid therethrough without capillary action, said channels not being pores, and which also permit passage of cooling fluid vapor generated at said wicking layer through said wicking member to an exhaust port in said housing;
   a condenser;
   flow communication means connecting said exhaust port to an inlet of said condenser; and
   flow communication means connecting an outlet of said condenser to said inlet port.

8. The thermosyphon of claim 7 wherein said wicking member comprises material selected from the group consisting of sintered copper, aluminum foam, silicon carbide, vitreous carbon, copper mesh and copper screen.

9. The system of claim 7 wherein said system includes a coolant fluid selected from the group consisting of water, refrigerant and fluorocarbon.

10. A system cooled by thermosyphon means comprising:
    a housing for containing an evaporatable cooling fluid, said housing having an extended surface for thermal contact with said body which is to be cooled, said extended surface having at least a portion thereof exposed to interior portions of said housing which also includes an inlet port;
    a wicking layer in thermal contact with said extended surface and disposed within the interior of said housing; and
    a wicking member in contact with said wicking layer, said wicking member also being disposed in said housing, said wicking member having a plurality of surface accessible channels, said channels being regularly shaped and sufficiently wide for the passage of liquid phase cooling fluid therethrough without capillary action, said channels not being pores, and which also permit passage of cooling fluid vapor generated at said wicking layer through said wicking member to an exhaust port in said housing;
    a condenser;
    flow communication means connecting said exhaust port to an inlet of said condenser;
    flow communication means connecting an outlet of said condenser to said inlet port; and
    an electronic package heat source in thermal contact with said extended surface of said housing.

11. The system of claim 10 wherein said system includes a coolant fluid selected from the group consisting of water, refrigerant and fluorocarbon.

12. The system of claim 10 wherein said wicking layer comprises material selected from the group consisting of sintered copper, aluminum foam, silicon carbide, vitreous carbon, copper mesh and copper screen.

\* \* \* \* \*